(12) United States Patent
Yamamoto

(10) Patent No.: US 9,410,235 B2
(45) Date of Patent: Aug. 9, 2016

(54) HARD COATING FILM HAVING ANTI-ADHESION PROPERTY TO SOFT METAL

(71) Applicant: KABUSHIKI KAISHA KOBE SEIKO SHO (KOBE STEEL, LTD.), Kobe-shi (JP)

(72) Inventor: Kenji Yamamoto, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 0 days.

(21) Appl. No.: 14/760,533

(22) PCT Filed: Dec. 26, 2013

(86) PCT No.: PCT/JP2013/084853
§ 371 (c)(1),
(2) Date: Jul. 13, 2015

(87) PCT Pub. No.: WO2014/119212
PCT Pub. Date: Aug. 7, 2014

(65) Prior Publication Data
US 2015/0352623 A1 Dec. 10, 2015

(30) Foreign Application Priority Data
Jan. 29, 2013 (JP) .................................. 2013-014676

(51) Int. Cl.
| | | |
|---|---|---|
| *B21D 37/01* | (2006.01) |
| *C23C 14/06* | (2006.01) |
| *C09D 1/00* | (2006.01) |
| *B21D 28/00* | (2006.01) |
| *B41J 2/11* | (2006.01) |
| *B21D 22/20* | (2006.01) |

(52) U.S. Cl.
CPC ............ *C23C 14/0676* (2013.01); *B21D 28/00* (2013.01); *B21D 37/01* (2013.01); *B41J 2/11* (2013.01); *C09D 1/00* (2013.01); *B21D 22/208* (2013.01)

(58) Field of Classification Search
CPC ...... B21D 37/01; B21D 28/00; B21D 22/208; C09D 1/00; B32B 15/013; C23C 14/0641; B41J 2/11
USPC .......................................................... 72/47
See application file for complete search history.

(56) References Cited

U.S. PATENT DOCUMENTS

| | | | |
|---|---|---|---|
| 2003/0148146 A1 | 8/2003 | Kubota et al. | |
| 2008/0003418 A1 | 1/2008 | Yamamoto et al. | |
| 2008/0171183 A1* | 7/2008 | Yamamoto ............ | B32B 15/013 428/215 |
| 2009/0269614 A1* | 10/2009 | Yamamoto .......... | C23C 14/0641 428/697 |
| 2010/0047454 A1* | 2/2010 | De Voeght ............... | B41J 2/211 427/256 |
| 2010/0215912 A1* | 8/2010 | Kubota ............... | C23C 14/0641 428/172 |
| 2011/0314991 A1* | 12/2011 | Yamamoto ............. | B21D 28/00 83/694 |
| 2015/0336851 A1* | 11/2015 | Yamamoto ............. | B21D 37/01 72/476 |

FOREIGN PATENT DOCUMENTS

| | | |
|---|---|---|
| CN | 1424434 | 6/2003 |
| JP | 6-172970 A | 6/1994 |
| JP | 2003-165003 A | 6/2003 |
| JP | 2007-224374 A | 9/2007 |
| JP | 2008-7835 A | 1/2008 |
| JP | 2010-58135 A | 3/2010 |
| JP | 2012-136775 A | 7/2012 |
| JP | 2012-149332 A | 8/2012 |
| WO | WO 2009/047867 A1 | 4/2009 |
| WO | 2012/147863 A1 | 11/2012 |

OTHER PUBLICATIONS

International Search Report and Written Opinion issued Apr. 1, 2014 in PCT/JP2013/084853 filed Dec. 26, 2013.
Office Action in corresponding Chinese Patent Application No. 201380071800.6, issued May 5, 2016.

* cited by examiner

*Primary Examiner* — David B Jones
(74) *Attorney, Agent, or Firm* — Oblon, McClelland, Maier & Neustadt, L.L.P

(57) ABSTRACT

The invention provides a hard coating film insusceptible to adhesion to a soft metal, the hard coating film being suitable for use as a coating on the surface of, for example, a die in contact with the soft metal. Further, the hard coating film includes a metal element containing at least two species of elements selected from the group consisting of Ti, Al, and Cr, and a non-metal element containing O (oxygen) only, or O and at least one species selected from the group consisting of C and N. A proportion accounting for the O in the total non-metal element is not less than 0.2, in atom ratio.

19 Claims, No Drawings

HARD COATING FILM HAVING ANTI-ADHESION PROPERTY TO SOFT METAL

TECHNICAL FIELD

The invention relates to a hard coating film having anti-adhesion property to a soft metal.

BACKGROUND ART

In the case of processing or sliding against a steel sheet with the surface thereof being made of a soft metal such as Zn, etc., that is, for example, a Zn-coated steel sheet, a problem can occur in that the soft metal adheres to the surface of a member (for example, a die, etc.) in contact with the soft metal to be further deposited on the surface of the member, thereby impairing the surface quality of a workpiece.

More specifically, there exists, for example, the following problem with a hot pressing method, as hot forming. The hot pressing (also called as "die-quench") method represents a technique whereby, upon a steel sheet (blank) being heated to a temperature (normally, 800 to 900° C.) in an austenite region to be quenched in a water-cooled die, the steel sheet is formed into the desired shape of a part. Process-steps from the heating of a steel sheet up to press working are carried out in the atmosphere from the view point of a cost, and therefore, for the purpose of controlling scale-formation due to oxidation of a steel sheet, a plated steel sheet with a plating layer composed of, primarily Al or Zn, formed on the surface thereof, is used for the steel sheet. However, in the case of using the plated steel sheet, that is, the zinc (Zn)-coated steel sheet in particular, Zn is adhered to a die for pressing along with an increase in the number of shots, thereby reaching a stage in which the die undergoes a change in shape in extreme cases, whereupon there arises a problem with a product shape, and the surface quality of a steel sheet as formed.

In general, a die for use in the hot pressing, and so forth is formed after coating the surface of the die with a ceramic film of TiN, etc., as countermeasures against abrasion wear. Even in this case, however, anti-adhesion property to the soft metal is far from sufficient.

SUMMARY OF INVENTION

Technical Problem

The present invention has been developed by taking note of the circumstances described as above, and it is therefore an object of the invention to provide a hard coating film insusceptible to adhesion to the soft metal, and a die serving as a hard-coating-film coating-member, in particular.

There is described below the case where the surface of a jig-tool (a die, in particular) is coated with the hard coating film according to the invention to serve as the hard-coating-film coating-member, by way of example, however, the hard coating film according to the invention may be formed on the surface of a slidable member, and so forth, as described later on.

Solution to Problem

According to the present invention which solves the above problem, there is provided a hard coating film having anti-adhesion property to a soft metal, including a metal element containing at least two species of elements selected from the group consisting of Ti, Al, and Cr, and a non-metal element made of O (oxygen) only, or O and at least one species selected from the group consisting of C and N. A proportion accounting for the O in the total non-metal element is not less than 0.2, in atom ratio.

According to another hard coating film of the present invention having anti-adhesion property to a soft metal may have arithmetic-mean roughness (Ra) of a surface thereof at 0.01 µm or more and 3 µm or less.

As preferable embodiments of the present invention, there is provided the hard coating film, satisfying the arithmetic-mean roughness (Ra) of a surface thereof, at 0.01 µm or more and 3 µm or less, and including a metal element containing at least two species of elements selected from the group consisting of Ti, Al, and Cr; and a non-metal element composed of O (oxygen) only, or O and at least one species selected from the group consisting of C and N, a proportion accounting for the O in the total non-metal element being not less than 0.2 in atom ratio.

The hard coating film may include
(a) the metal element composed of Ti, Cr, and Al, proportions (atomic ratios) accounting for the respective metal elements in the total metal element being in a range of Ti:0.10 or more and 0.40 or less, Cr:0.10 or more and 0.40 or less, and Al:0.40 or more and 0.70 or less, and
(b) the metal element composed of Ti, Cr, Al, and Si, proportions (atomic ratios) accounting for the respective metal elements in the total metal element being in a range of Ti:0.10 or more and 0.40 or less, Cr:0.10 or more and 0.40 or less, Al:0.40 or more and 0.70 or less, and Si:0.010 or more and 0.10 or less.

A part of the metal elements may be replaced with at least one species of metal element selected from the group consisting of the group 4 elements, the group 5 elements, and the group 6 elements, according to the periodic table, Si, Y, and B, up to 0.2, as the upper limit of the proportion (atom ratio) accounting for the part of the metal elements in the total metal element.

The resent invention includes a die, the surface thereof being coated with the hard coating film.

If the die is used for the hot-working of a workpiece (for hot working of a Zn-coated steel sheet, in particular), composed of at least one species of soft metal selected from the group consisting of Zn, Sn, Al, and Mg, the advantageous effects of the present invention is sufficiently exhibited.

Advantageous Effects of Invention

The hard coating film according to the present invention is excellent in anti-adhesion property to a soft metal (hereinafter referred to simply as "anti-adhesion property" on occasion). Accordingly, if the hard coating film according to the present invention is formed on the surface of a die•jig (hereinafter generically called "jig-tool") for use in, for example, plastic processing, and cutting process, or cutting work, etc., it is possible to control adhesion of the soft metal, on the surface of the jig-tool, occurring at a time when the jig-tool comes into contact with a workpiece made up of the soft metal. Even in the case where the processing described as above is hot working (hot pressing which is hot forming, in particular), it is possible to control the adhesion of the soft metal, on the surface of the jig-tool. As a result, the jig-tool can be stably and repeatedly used over the long term.

DESCRIPTION OF EMBODIMENTS

The inventors have repeatedly continued strenuous studies in order to solve the problem described as above. As a result, the inventors have found that in order to enhance anti-adhesion property of the jig-tool against a soft metal, it is effective to form a hard coating film on the top surface of the jig-tool, the hard coating film whose insulating properties are enhanced by causing O (oxygen) to be contained therein.

In order to cause the hard coating film to exhibit excellent anti-adhesion property, a proportion accounting for the O in the total non-metal element making up the hard coating film need be not less than 0.2, in atom ratio. The proportion (atom ratio) of the O is preferably not less than 0.5, and more preferably not less than 0.7. There is no particular upper limit to the proportion of the O, and the non-metal elements may be oxygen only (in other words, the proportion accounting for the O in the total non-metal element may be 1 in terms of the atom ratio).

The non-metal element is composed of the O (oxygen) only, or O and at least one species selected from the group consisting of C and N. If the O, together with the at least one species selected from the group consisting of C and N is contained as the non-metal element, the hardness of the hard coating film can be further increased. The proportion (atom ratio, or the total atom ratio if both C and N are contained) accounting for the at least one species in the total non-metal element can be not less than 0.10 (further, not less than 0.20). Furthermore, the upper limit of the atom ratio of the at least one species selected from the group consisting of C and N will be at 0.8 on the basis of the proportion of the O.

The hard coating film according to the present invention contains at least two species of elements selected from the group consisting of Ti, Al, and Cr, as metal elements. Further, a part of the metal elements may be replaced with at least one species of metal element (hereinafter, referred to as "X-group element" on occasion) selected from the group consisting of the group 4 elements, the group 5 elements, and the group 6 elements, according to the periodic table, Si, Y, and B, up to 0.2, as the upper limit of the proportion (atom ratio indicating a single quantity in the case of a single element, while indicating the total quantity in the case of plural elements) accounting for the part of the metal elements in the total metal element. If the X-group element is contained, an X-group element quantity can be, for example, not less than 0.01. The anti-adhesion property will not deteriorate due to displacement described as above.

With the hard coating film according to the present invention, a contact (slidable) target thereof is mainly a soft metal, such as Zn, and Sn, etc., however, in the case where the contact (slidable) target is the Zn-coated steel sheet, a portion of the steel sheet, without zinc-plating being formed, (that is, the steel sheet) can occasionally end up in serving as the slidable target. Furthermore, in the case of hot working, there occurs contact with the steel sheet heated to a high temperature. Accordingly, heat resistance/oxidation resistance, as well, are required of the hard coating film. From the viewpoint of imparting these properties (the oxidation resistance, in particular) to the hard coating film, the metal elements of the hard coating film preferably contain TiAl, CrAl, TiCrAl, or these metal elements with Si additionally contained therein, more preferably the metal elements containing TiCrAl or TiCrAlSi.

In the case of the metal elements containing TiCrAl, the proportions (the atomic ratios) accounting for the respective metal elements in the total metal element are preferably in a range of Ti:0.10 or more and 0.40 or less, Cr:0.10 or more and 0.40 or less, and Al:0.40 or more and 0.70 or less. Further, in the case of the metal element being TiCrAlSi, the proportions (the atomic ratios) accounting for the respective metal elements in the total metal element are preferably in a range of Ti:0.10 or more and 0.40 or less, Cr:0.10 or more and 0.40 or less, Al:0.40 or more and 0.70 or less, and Si:0.010 or more and 0.10 or less.

Further, the inventors have found that formation of the hard coating film having a surface whose arithmetic mean roughness (Ra) satisfies a range of from 0.01 µm up to 3 µm, on the top surface of the jig-tool in contact with the soft metal, is also effective in enhancement of the anti-adhesion property of the jig-tool against the soft metal.

To go into details, the inventors have found that, if, upon the soft metal coming into contact with the top surface of the jig-tool, a contact area therebetween is large, adhesion is susceptible to occur, whereas if the hard coating film opposed to the top surface of the jig-tool has a suitable roughness in a range described as above, adhesion is insusceptible to occur. If the Ra is less than 0.01 µm, the soft metal comes into contact with the hard coating film across the surface thereof, thereby causing the contact area to be increased, so that the adhesion is susceptible to occur. Accordingly, the Ra is set to 0.01 µm or more. The Ra is more preferably 0.10 µm or more, still more preferably 0.5 µm or more, yet more preferably 1.0 µm or more, and most preferably 1.5 µm or more. On the other hand, if the Ra exceeds 3 µm, projections on the surface of the hard coating film, that is, projections on the surface of the jig-tool will be too high, whereupon a rough surface texture of the jig-tool is printed in the soft metal as the contact target to thereby increase the surface roughness of the soft metal. For this reason, this is not recommendable. Accordingly, the Ra is set to 3 µm or less. The Ra is preferably 2.5 µm or less, and more preferably 2 µm or less.

The Ra is measured by a method described in a working example described later on in the present description.

For a method of forming the hard coating film according to the present invention, vapor phase coating methods, such as an ion plating method (for example, the AIP method: Arc Ion Plating method, etc.), a sputtering method can be used. In order to obtain the hard coating film having the Ra described as above, it is recommendable to adjust the surface roughness of a substrate before formation of the hard coating film to subsequently form the hard coating film as smooth as possible on the surface of the substrate, as described later on, thereby reproducing a surface-texture of the substrate so as to be faithful to a surface texture of the hard coating film. In order to form the hard coating film as smooth as possible, a filtered arc ion plating method, or the sputtering method is preferably used among the vapor phase coating methods. With the use of the sputtering method, in particular (further, a UBMS (Unbalanced Magnetron Sputtering) method, in particular), the hard coating film more excellent in anti-adhesion property can be formed because a particle acting as the starting point of a pin-hole does not occur in theory. For a deposition condition in forming the film by use of the respective methods described as above, it need only be sufficient to adopt a general condition. In forming the hard coating film according to the present invention by use of any of those methods, the target made of the metal element (including the X-group element, as necessary) of the hard coating film is used, while using an atmospheric gas including an oxygen gas, a nitrogen gas as necessary, a hydrocarbon gas, such as methane, etc., and Ar gas, etc.

Further, in the case of the filtered arc ion plating method, the deposition condition includes, for example, a substrate temperature: 300 to 700° C., a bias voltage: −30 to −70V (by minus notation of a bias voltage is meant a substrate at a minus potential against the earth potential and the same applies hereinafter), and a total gas-pressure: 1 to 5 Pa. In the case of the sputtering method, a deposition condition includes, for example, a substrate temperature: 300 to 700° C., an input electric-power: for example, 3 kW (in the case of a target diameter being at 6 inches), and the total gas-pressure: for example, 0.6 Pa.

In order to obtain the hard coating film having the (Ra), it is recommendable to adjust the surface roughness of the substrate before the formation of the hard coating film, as described in the foregoing. The roughness of a substrate surface before coating with the hard coating film is not necessarily required to fall within the range of the Ra of the hard coating film. There is cited a method whereby the substrate surface is worked on by use of, for example, shot blasting, and so forth, to thereby cause the Ra of the substrate surface to fall within a range of, for example, Ra 1.5 µm±20%, subsequently forming the hard coating film on the substrate surface. In order to remove a sharp angle having occurred by application of the shot blasting, it is recommendable to further apply polishing by use of, for example, projection polishing, within a range where the shape of the substrate surface is not caused to undergo a large change. Further, in order to remove the particle, and so forth, attached to the surface of the hard coating film, it is recommendable to apply, for example, the projection polishing after the formation of the hard coating film.

The present invention includes a die, in particular, as well, serving as a hard-coating-film coating-member with the hard coating film being coated on the surface (the top surface) thereof.

If the hard-coating-film coating-member (the die, in particular, and a hot-press die, in more particular) is used in the case of applying the hot working (hot pressing using the Zn-coated steel sheet susceptible to adhesion, for use as a workpiece, in particular) to a workpiece (a workpiece for forming), at least the surface thereof being composed of a soft metal (Zn, etc.), this will enable the advantageous effects of the present invention to be sufficiently exhibited.

A metal and an alloy, made of at least one species of element selected from the group consisting of Zn, Sn, Al, and Mg, is cited as the soft metal.

The "workpiece (workpiece for forming), at least the surface thereof being made of the soft metal (Zn, etc.)" includes a pure-aluminum material, an aluminum-based alloy-material, a pure-Sn material, an Sn-based alloy-material, a pure-Zn material, a Zn-based alloy-material, and an Mg-based alloy-material, etc., besides a metal sheet (for example, a steel sheet) provided with a plating layer of the at least one species of element selected from the group consisting of Zn, Sn, Al, and Mg. If the Zn-coated steel sheet (including a hot-dip galvanizing-coated steel sheet (GI), a hot-dip galvannealing-coated steel sheet (GA), and an electrogalvanizing steel sheet (EG)), in particular, is used as the workpiece (the workpiece for forming) described as above, the advantageous effects of the present invention are sufficiently exhibited.

A method for processing a workpiece, other than the plated steel sheet, includes, for example, forging of an Al-based metal, Al die-casting, Zn die-casting, Mg die-casting, and so forth.

The hard coating film according to the present invention can be applied to a die used in forging, and extrusion, etc., the jig-tool (including a cutting tool, such as a tip, a drill, an end mill, etc., and a blanking punch, etc.), and a slidable member of automobile part as well as machine parts, etc., serving as the hard-coating-film coating-member, respectively, besides the hot-press die described as above.

If at least a portion of the hard-coating-film coating-member (the die, in particular), in contact with the soft metal, is coated with the hard coating film according to the present invention, this will be sufficient whatever coating on a portion of the hard coating film, out of contact with the soft metal, may be.

A film thickness of the hard coating film according to the present invention is preferably not less than 0.5 µm. This is because coating will be insufficient if the film thickness is less than 0.5 µm, so that the substrate will be exposed on occasion. The film thickness is more preferably not less than 1 µm. On the other hand, if the film thickness of the hard coating film is excessively large, peel off is susceptible to occur, so that the film thickness of the hard coating film is preferably not more than 10 µm. The film thickness is more preferably not more than 5 µm.

It need only be sufficient to have the hard-coating-film coating-member (the die, in particular), the top surface thereof being made up of the hard coating film specified by the present invention, and a hard coating film other than the hard coating film specified by the present invention, and an intermediate layer, such as CrN, and TiN, etc., may be formed between the hard coating film on the top surface and the substrate.

This application claims a Convention Priority on Japanese Patent Application No. 2013-014676, submitted for application on Jan. 29, 2013, which is incorporated herein by reference. The whole contents of Japanese Patent Application No. 2013-014676, submitted for application on Jan. 29, 2013, are incorporated herein by reference.

WORKING EXAMPLES

Referring to working examples, the present invention is more specifically described hereunder, however, it is to be understood that the present invention is obviously not limited thereto. It should be understood that the present invention can be practiced by addition of various modifications as appropriate in the light of teachings described in the foregoing and later on, and any of the modifications is to be included in the technical scope of the present invention.

Working Example 1

In the case of Working Example 1, a (TiCrAlSi) film, and an (ON) film (the compositions of the respective films, in atom ratio, are (Ti:0.20, Cr:0.20, Al:0.55, and Si:0.05) and (O:0.80, N:0.20)) were used, and surface roughness was varied, thereby having reviewed the effect of the surface roughness, exerted on anti-adhesion property.

There was prepared an SKD61 die (substrate), which is a steel material of an alloy tool steel according to JIS standard, for use in evaluation of surface roughness, and evaluation of anti-adhesion property.

Mirror polishing or the shot blasting was applied to the substrate, as shown in Table 1, prior to formation of a coating, having thereby adjusted roughness of the substrate to a value close to the Ra shown in Table 1. Subsequently, the coating about 3 µm was formed by use of the filtered arc ion plating method (denoted as "filtered AIP" in Table 1), or the unbalanced magnetron sputtering method (denoted as "UBMS" in Table 1).

In the case of the filtered arc ion plating method (the filtered AIP), a deposition condition included a substrate temperature: 400° C., a total gas-pressure: 2 Pa, and a bias voltage: −70V. Further, in the case of the unbalanced magnetron sputtering method (the UBMS), a deposition condition included a substrate temperature: 400° C., a total gas-pressure: 0.6 Pa, and an input electric-power: 3 kW (in the case of a target diameter being at 6 inches). With either of those methods, a TiCrAlSi target, the composition (in atom ratio) thereof being (Ti:0.20, Cr:0.20, Al:0.55, and Si:0.05) was used, as the target. Further, for an atmospheric gas at the time of forming the film, a mixed gas of oxygen+nitrogen was used in the case of the filtered AIP, while a mixed gas of argon+oxygen+nitrogen was used in the case of the UBMS. Furthermore, samples (Sample No. 1, and Sample No. 2), without the coating formed therein, were also prepared as Comparative Samples.

Then, the polishing of a coating surface was executed by use of a projection-type polishing machine (Aero lap (registered trademark) manufactured by Yamashita Works Co., Ltd.) after the formation of the film, thereby having produced samples whose Ra values shown in Table 1 were found various. In the present working example, execution time of the shot blasting as a method for adjusting a substrate surface, and the size of a projection particle used in the shot blasting, as shown in Table 1, were varied, thereby having produced samples whose Ra values differ from each other although the component composition of the coating as well as the method for forming the film were not varied.

(Evaluation of Anti-Adhesion Property To Soft Metal)

Zn was selected as a representative of the soft metal, while the hot-dip galvannealing-coated steel sheet (GA) (Zn-coated steel sheet) was prepared as a sheet material (blank). Then, bending, by use of a bending die with•without the coating, was applied to the Zn-coated steel sheet heated to the following temperature under the following deposition condition, having thereby looked into a Zn-adhesion state on the surface of the bending die after processing (Deposition Condition)

sheet material (blank): a hot-dip galvannealing-coated (GA) steel sheet (tensile strength: 590 MPa, sheet thickness: 1.4 mm), bending die material: SKD61 which is the steel material of the alloy tool steel according to JIS standard+the respective coatings shown in Table 1, thrust load: 1 t heating temperature: 760° C.

Subsequently, the Zn-adhesion state was classified into six stages as shown in the following evaluation criterions,

TABLE 1

| No. | Pretreatment of substrate-surface | Coating* | Film-forming method | Post treatment | Ra (μm) | Adhesion amount |
|---|---|---|---|---|---|---|
| 1 | Mirror polishing | None | None | — | 0.005 | 5 |
| 2 | Shot blasting (#80) | None | None | — | 1.5 | 4 |
| 3 | Mirror polishing | TiCrAlSi(ON) | Filtered AIP | Yes | 0.01 | 3 |
| 4 | Shot blasting (#200) | TiCrAlSi(ON) | Filtered AIP | Yes | 0.076 | 3 |
| 5 | Shot blasting (#200) | TiCrAlSi(ON) | Filtered AIP | Yes | 0.132 | 2 |
| 6 | Shot blasting (#100) | TiCrAlSi(ON) | Filtered AIP | Yes | 0.18 | 2 |
| 7 | Shot blasting (#80) | TiCrAlSi(ON) | Filtered AIP | Yes | 0.7 | 1 |
| 8 | Shot blasting (#80) | TiCrAlSi(ON) | Filtered AIP | Yes | 1.5 | 0 |
| 9 | Shot blasting (#30) | TiCrAlSi(ON) | UBMS | Yes | 1.7 | 0 |
| 10 | Shot blasting (#30) | TiCrAlSi(ON) | Filtered AIP | Yes | 2.5 | 0 |
| 11 | Shot blasting (#30) | TiCrAlSi(ON) | Filtered AIP | Yes | 3 | 2 |
| 12 | Shot blasting (#30) | TiCrAlSi(ON) | Filtered AIP | Yes | 4 | 4 |

*TiCrAlSi(ON) = (Ti0.20Cr0.20Al0.55Si0.05)(O0.80N0.20) (A numerical value indicates an atom ratio.)

Using these samples, evaluation of the surface texture of a coating (Ra), and evaluation of anti-adhesion property were executed as follows.

Measurement of Surface Roughness (Ra)

The Ra of each of the samples was measured by a method provided in JIS B0601, shown in Table 2 (a cutoff value and an evaluation length, at the time of finding Ra, are shown) with the use of a contact-finger type surface-roughness tester.

TABLE 2

| Ra range (μm) | | Cutoff value $\lambda_c$ | Evaluation length $l_n$ |
|---|---|---|---|
| in excess of | or less | (mm) | (mm) |
| (0.006) | 0.02 | 0.08 | 0.4 |
| 0.02 | 0.1 | 0.25 | 1.25 |
| 0.1 | 2.0 | 0.8 | 4 |
| 2.0 | 10.0 | 2.5 | 12.5 |
| 10.0 | 80.0 | 8 | 40 |

Shown inside ( ) is a reference value.

A measurement described as above was conducted at five optional spots on the surface of the coating, thereby having adopted an average value of respective values obtained by the measurements. Further, the sample No. 1, and the sample No. 2 each being the example in which the coating was not formed, Ra in Table 1 indicates the results of each measurement on the surface roughness of the substrate simply for the purposes of reference.

thereby having evaluated Zn-adhesion state such that the stage 3 or lower was excellent in anti-adhesion property.

(Evaluation Criterions)

A proportion (%) of a Zn-adhesion area on the surface of the bending die, in contact with the sheet material, was found, thereby having made evaluations in 0 through 5 stages as follows:

5: in excess of 60%
4: in excess of 30%, 60% or less
3: in excess of 20%, 30% or less
2: in excess of 10%, to 20% or less
1: in excess of 5%, to 10% or less
0: 5% or less These results are shown in Table 1.

The following is evident from Table 1. Because Sample No. 1 has no coating on the surface of the die, and the surface was smooth, an adhesion amount of the soft metal was considerably increased. Further, Sample No. 2 has no coating on the surface of the die either, however, because the surface roughness of the die is controlled by virtue of the shot blasting in this case, an adhesion amount of the soft metal was found less than that in the case of the die whose surface was subjected to the mirror polishing.

Sample No. 12 has a coating formed on the surface of the die, but Ra on the surface of the coating is excessively large in value, and therefore, an adhesion amount of the soft metal was increased.

In each of Samples Nos. 3 through 11, a hard coating film, Ra thereof being within a prescribed range of the present invention, was formed to serve as a coating, and it is evident that an adhesion amount of a soft metal can be sufficiently controlled by use of a die with the hard coating film formed on the surface thereof.

Furthermore, Ra on the surface of a coating, in the respective cases of Sample No. 3 and Sample No. 4, was smaller in value than that in the respective cases of Samples Nos. 5 through 11, while an adhesion amount of a soft metal in the former cases was found greater in value than that in the latter cases although an adhesion amount of a soft metal was within tolerance.

Working Example 2

In Working Example 2, there were formed various coatings having surface roughness that is substantially fixed, and the component compositions differing from each other, thereby having reviewed the effect of the component composition of a film, exerted on the anti-adhesion property.

To describe in detail, shot blasting with the use of a bending die as a substrate was applied prior to formation of a coating on the surface of the substrate, and subsequently, coatings of various component-compositions shown in Table 3 were formed by use of a film-forming method shown in Table 3, and the polishing of a coating surface was carried out in the same way as in the case of Working Example 1, thereby rendering surface roughness with respect to any of samples to be substantially fixed (Ra:1.5 to 1.7 μm).

For the formation of the coatings described as above, respective targets made of metal elements contained in the respective coatings shown in Table 3 were used. Further, in the case of Sample Nos. 1 through 4, an atmospheric gas at the time of forming the film was a pure nitrogen gas, while, in the cases of Sample Nos. 5 through 9, Sample Nos. 11 through 13, and Sample Nos. 15 through 19, respectively, the atmospheric gas at the time of forming the film was a mixed gas of oxygen+(at least one species selected from the group consisting of nitrogen and methane). In the cases of Sample No. 10, and No. 14, respectively, the atmospheric gas at the time of forming the film was a pure oxygen-gas. Other aspects of a sample-preparation condition, including the deposition condition, were the same as in the case of Working Example 1.

The evaluation of anti-adhesion property, using the samples obtained, was conducted in the same way as in the case of Working Example 1. The results of the evaluation are shown in Table 3.

TABLE 3

| No. | Coating * | Film-forming method | Adhesion amount |
|---|---|---|---|
| 1 | TiN | Filtered AIP | 3 |
| 2 | CrN | Filtered AIP | 3 |
| 3 | (Ti0.50Al0.50)N | Filtered AIP | 3 |
| 4 | (Ti0.20Cr0.20Al0.55Si0.05)N | Filtered AIP | 3 |
| 5 | (Ti0.20Cr0.20Al0.55Si0.05)(O0.10N0.90) | Filtered AIP | 3 |
| 6 | (Ti0.20Cr0.20Al0.55Si0.05)(O0.20N0.80) | Filtered AIP | 2 |
| 7 | (Ti0.20Cr0.20Al0.55Si0.05)(O0.35N0.65) | Filtered AIP | 1 |
| 8 | (Ti0.20Cr0.20Al0.55Si0.05)(O0.50N0.50) | Filtered AIP | 1 |
| 9 | (Ti0.20Cr0.20Al0.55Si0.05)(O0.70N0.30) | Filtered AIP | 0 |
| 10 | (Ti0.20Cr0.20Al0.55Si0.05)O | Filtered AIP | 0 |
| 11 | (Ti0.40Al0.60)(O0.90N0.10) | Filtered AIP | 2 |
| 12 | (Al0.50Cr0.40Si0.10)(O0.85N0.15) | Filtered AIP | 1 |
| 13 | (Ti0.25Cr0.10Al0.65)(O0.90N0.10) | Filtered AIP | 1 |
| 14 | (Ti0.50Cr0.50)O | Filtered AIP | 3 |
| 15 | (Ti0.20Cr0.20Al0.55Si0.03Y0.02)(O0.80N0.20) | Filtered AIP | 0 |
| 16 | (Al0.50Cr0.40W0.10)(O0.90N0.10) | Filtered AIP | 2 |
| 17 | (Ti0.20Cr0.20Al0.55Si0.05)(O0.50N0.30C0.20) | Filtered AIP | 1 |
| 18 | (Ti0.20Cr0.20Al0.55Si0.05)(O0.50N0.10C0.40) | Filtered AIP | 1 |
| 19 | (Ti0.20Cr0.20Al0.55Si0.05)(O0.50C0.50) | Filtered AIP | 1 |

* A numerical value indicates an atom ratio. Further, each Ra value on the surface of the coating was within a range of 1.5 to 1.7 μm.

The following is evident from Table 3. Sample Nos. 1 through 5 each are a sample in which the surface roughness as prescribed is satisfied. Because these samples either contain no oxygen (O), or is short in oxygen, an adhesion amount of a soft metal was on a slightly higher side.

In the case of each of Sample Nos. 6 through 19, the hard coating film according to the present invention, satisfying both the surface roughness as prescribed and the component composition as prescribed, was formed so as to serve as the coating, so that if a die with the hard coating film formed on the surface thereof is used, it is evident that the adhesion amount of the soft metal can be sufficiently controlled. In the case of Sample Nos. 5 through 9, metal elements making up the hard coating film, in the respective samples, are identical to each other, while a ratio of non-metal element O to N is varied and it is evident that as a proportion accounting for an oxygen quantity in the non-metal element in the hard coating film becomes greater, so the adhesion amount of the soft metal tends to be smaller.

The invention claimed is:

1. A hard coating, comprising:
    at least two metal elements selected from the group consisting of Ti, Al, and Cr; and
    a non-metal element comprising O only, or comprising O and at least one element selected from the group consisting of C and N,
    wherein relative to the non-metal element in total, an atomic ratio of O is not less than 0.2.

2. The hard coating film according to claim 1, having a surface with an arithmetic-mean roughness of 0.01 μm or more and 3 μm or less.

3. The hard coating film according to claim 1, wherein
    the metal elements comprises Ti, Cr, and Al, and
    relative to the metal elements in total, Ti, Cr, and Al have the following atomic ratios, respectively:
    Ti:0.10 or more and 0.40 or less;
    Cr:0.10 or more and 0.40 or less; and
    Al:0.40 or more and 0.70 or less.

4. The hard coating film according to claim 1, wherein
    the metal elements comprise Ti, Cr, Al, and Si, and
    relative to the metal elements in total, Ti, Cr, Al, and Si have the following atomic ratios, respectively:
    Ti:0.10 or more and 0.40 or less;
    Cr:0.10 or more and 0.40 or less;
    Al:0.40 or more and 0.70 or less; and
    Si:0.010 or more and 0.10 or less.

5. The hard coating film according to claim 1, wherein
    a part of the metal elements is replaced with at least one species of metal element selected from the group consisting of a group 4 element, a group 5 element, a group 6 element, Si, Y, and B, and
    relative to the metal elements in total, an atomic ratio of the replaced is up to 0.2.

6. A die, having a surface coated with the hard coating film according to claim 1.

7. The hard coating film according to claim 1, which has a thickness of 0.5 μm to 10 μm.

8. The hard coating film according to claim 1, which has a thickness of 0.5 μm to 5 μm.

9. The hard coating film according to claim 1, wherein the metal elements comprise Ti, Cr and Al.

10. The hard coating film according to claim 1, wherein the metal elements comprise Ti, Cr, Al and Si.

11. The hard coating film according to claim 1, having a surface with an arithmetic-mean roughness of 0.1 μm or more and 2.5 μm or less.

12. The hard coating film according to claim 1, having a surface with an arithmetic-mean roughness of 0.5 μm or more and 2 μm or less.

13. The hard coating film according to claim 1, wherein the non-metal element comprises O only.

14. The hard coating film according to claim 1, wherein the non-metal element comprises O and at least one element selected from the group consisting of C and N.

15. The hard coating film according to claim 1, wherein relative to the non-metal element in total, the atomic ratio of O is not less than 0.5.

16. The hard coating film according to claim 1, wherein relative to the non-metal element in total, the atomic ratio of O is not less than 0.7.

17. A method for making a hot-working workpiece, the method comprising:
employing the die according to claim 6 in making the hot-working workpiece, which comprises at least one species of soft metal selected from the group consisting of Zn, Sn, Al, and Mg.

18. A method for making a hot-working Zn-coated steel sheet, the method comprising:
employing the die according to claim 6 in making the hot-working Zn-coated steel sheet.

19. A die, having a surface coated with the hard coating film according to claim 2.

\* \* \* \* \*